United States Patent [19]

Nolde et al.

[11] Patent Number: 4,607,393
[45] Date of Patent: Aug. 19, 1986

[54] RECEIVER CIRCUIT COMPRISING TWO PHASE CONTROL LOOPS

[75] Inventors: Wolfgang Nolde, Hamburg; Winfried Jansen, Ellerbek, both of Fed. Rep. of Germany

[73] Assignee: U.S. Philips Corporation, New York, N.Y.

[21] Appl. No.: 655,963

[22] Filed: Sep. 28, 1984

[30] Foreign Application Priority Data

Sep. 28, 1983 [DE] Fed. Rep. of Germany ....... 3335024

[51] Int. Cl.⁴ .......................... H04B 1/26; H04H 5/00
[52] U.S. Cl. ..................................... 455/208; 455/214; 455/260; 455/263; 455/265; 381/13; 331/11
[58] Field of Search ............... 455/208, 258, 259, 260, 455/265, 182, 183, 214, 263; 381/3, 13; 329/122, 123, 50; 331/10, 11, 32, 47, 55

[56] References Cited

U.S. PATENT DOCUMENTS

| | | | |
|---|---|---|---|
| 3,622,913 | 11/1971 | Shipley | 455/260 |
| 4,273,958 | 6/1981 | Hirata | 455/260 |
| 4,370,520 | 1/1983 | Malchow | 381/15 |
| 4,387,470 | 6/1983 | Maurer et al. | 455/208 |
| 4,451,930 | 5/1984 | Chapman et al. | 455/260 |
| 4,454,607 | 6/1984 | Ogita | 381/13 |
| 4,539,707 | 9/1985 | Jacobs et al. | 455/260 |

FOREIGN PATENT DOCUMENTS 88467 9/1983 European Pat. Off. ............ 455/208

OTHER PUBLICATIONS

"Grundig Technische Informationen", No. 12, 1980. "Logische Grundschaltungen".

*Primary Examiner*—Jin F. Ng
*Attorney, Agent, or Firm*—William J. Streeter

[57] ABSTRACT

An FM receiver for demodulating an RF carrier signal containing a pilot frequency signal is provided. The receiver includes first and second frequency control loops. The first frequency control loop selects the local oscillator signal frequency. The reference signal oscillator in the first frequency control loop forms a part of a second frequency control loop. The second frequency control loop locks the phase of the reference signal oscillator with a detected pilot signal. In this way, the tuning signal of the local oscillator is kept phase locked to the detected pilot signal. Additional provisions are provided for changing the divisor of the second phase lock loop such that the time for establishing phase lock is reduced.

7 Claims, 4 Drawing Figures

| $s_6$ | $s_5$ | $s_4$ | $s_3$ | $s_2$ | $s_1$ | $sm$ | $sp$ |
|---|---|---|---|---|---|---|---|
| 1 | 1 | 1 | 1 | 0 | 1 | 1 | 0 |
| 1 | 1 | 1 | 1 | 1 | 0 | 0 | 0 |
| 1 | 1 | 1 | 1 | 1 | 1 | 0 | 1 |

RECEIVER CIRCUIT COMPRISING TWO PHASE CONTROL LOOPS

The invention relates to a circuit for a receiver comprising a first phase control loop which is synchronized with a reference oscillator and supplies a signal to a mixer stage which converts the received RF-signal to an intermediate frequency. A second phase control loop which is provided for synchronizing the reference oscillator to a pilot signal contained in the modulating signal of the received RF-signal.

A phase control loop must be understood to mean a circuit comprising a frequency-controllable oscillator whose output signal is applied—optionally by a fixed or adjustable frequency divider—to a phase discriminator, which compares this signal with a reference signal. An output signal corresponding to the phase difference, is used—preferably with a low-pass filter—to control the frequency of the oscillator. Phase control loops of this type are now commonly denoted as "PLL-circuits".

"Pilot signal" must here and in the further course of the description be understood to mean a signal contained in the modulating signal of the received signal and having a constant frequency—preferably the 19 kHz pilot tone in the stereomultiplex signal of an FM stereo transmitter.

A circuit of the type described in the opening paragraph is known, for example, from the periodical "Grundig Technische Informationen", No. ½, 1980, page 12, FIG. 12. Therein the first phase control loop comprises a frequency divider which is programmable for tuning purposes, whilst the second phase control loop is part of a stereo decoder. The two phase control loops require a total of two voltage controlled oscillators—at least the oscillator included in the second phase control loop requiring adjustment—and a reference oscillator.

SUMMARY OF THE INVENTION

It is an object of the invention to reduce the cost and designing efforts for a circuit having two phase control loops.

Based on a circuit of the type described in the opening paragraph, this object is accomplished in that the frequency of the reference oscillator is electronically controllable and is included in the second control loop.

U.S. Pat. No. 4,454,607 discloses a FM-receiver with synthesizer tuning, which is tuned by means of tuning data supplied by a CPU (Central Processing Unit). The CPU employs as a clock pulse generator a voltage-controlled oscillator included in a phase control loop, which is synchronized by the 19 kHz-stereo pilot of a stereo multiplex signal. As is known, the value of the tuning number depends on a value which is entered into the CPU and does not depend on the precise frequency of the clock pulse generator. Consequently, the tuning of this prior art FM-receiver is not synchronized with the 19 kHz stereo pilot and an additional and very stable reference oscillator must of necessity be used to stabilize the tuning frequency.

The reference oscillator of the circuit according to the invention, however, has the following dual function. In the first phase control loop it acts as a reference oscillator and in the second phase control loop it acts as a voltage-controlled oscillator which is in synchronism with the pilot signal. As a result the voltage-controlled oscillator which would otherwise be additionally required for the second phase control loop can be omitted, and also the adjusting operation required for this oscillator is not longer necessary.

When signals are received which do not contain a pilot signal the reference oscillator is not synchronized, so it oscillates at its own natural frequency. When this frequency deviates from the natural oscillation frequency when it is synchronized by the pilot signal, the frequency of the signal applied from the first phase control loop to the mixer stage also changes. That is to say the tuning thereof is changed in dependence on the fact whether a pilot signal is received or not received. To keep this change as small as possible, the reference oscillator must have a highest possible frequency stability, which can, for example, be accomplished with a quartz oscillator. Particularly for this case a further embodiment of the invention provides that the frequency of the oscillator is at least approximately an integral multiple of the frequency of the pilot signal. However, the oscillator frequency may alternatively be a rational multiple of the pilot frequency.

When a tuning action to a transmitter transmitting a pilot signal is initiated, comparatively large phase differences between the pilot signal and the signal derived from the reference oscillator may occur, and the phase discriminator effects a comparatively large detuning of the reference oscillator. Because of the presence of the frequency divider this detuning of the reference oscillator usually effects a still larger detuning of the oscillator comprised in the first phase control loop, affecting the tuning of the receiver. The extent to which the receiver tuning is affected can be so large that correct tuning to the transmitter is not possible. In accordance with a further embodiment of the invention this can be prevented when the output voltage of the phase discriminator is conveyed through a limiter. The limiter then limits detuning of the reference oscillator and consequently detuning of the oscillator in the first control loop.

Because of this limitation, in the event of significant phase deviations, the frequency of the reference oscillator can only be slowly synchronized with the pilot signal, which is unwanted in many cases. A faster synchronization can be accomplished in accordance with a further embodiment of the invention with a circuit for changing the frequency division ratios of the frequency divider controlled by the output signal of the phase discriminator through a threshold device. This construction is however independent of the invention. It can be used in all cases in which a fast synchronization of the phase control loop is important.

DESCRIPTION OF THE FIGURES

The invention will now be described in greater detail by way of example with reference to the accompanying drawings, in which.

DESCRIPTION OF THE PREFERRED EMBODIMENTS

Figure 1:
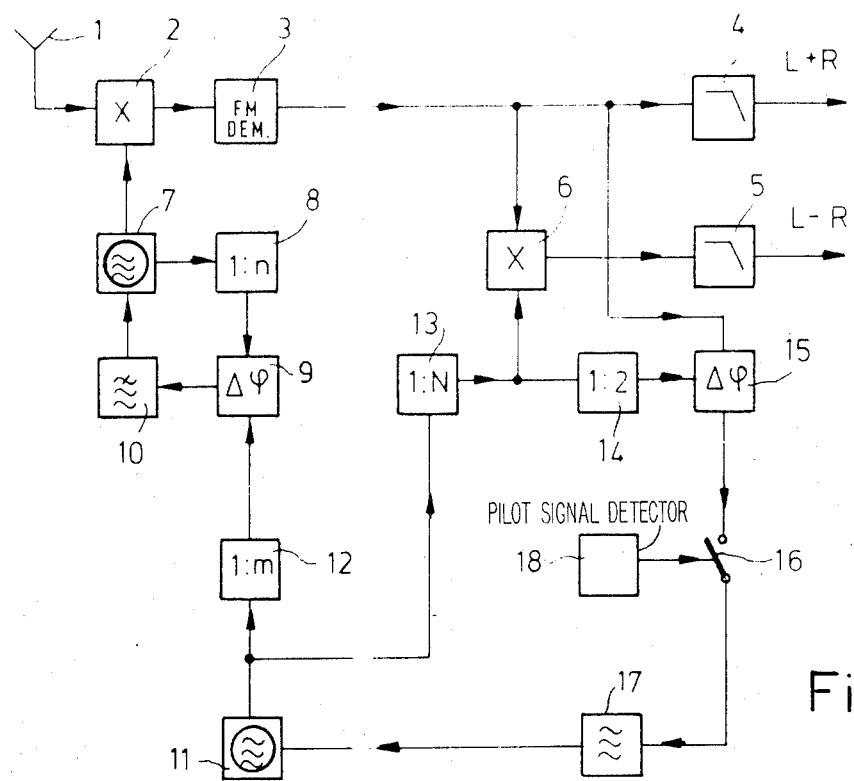
FIG. 1 shows an embodiment of the invention.

FIG. 1 shows the block diagram of a VHF-receiver for receiving stereo signals. The received signal is applied from the aerial 1 directly or by a preamplifier, not shown, to a mixer stage 2 in which it is mixed with an oscillator signal, so that the received signal is converted to the intermediate frequency range, for example 10.7 MHz. The intermediate frequency signal is amplified and demodulated by an FM-demodulator 3. The modulating signal, a multiplex signal in the event of a stereo transmission, contains in addition to the sum signal for the left (L) and the right (R) channel a 19 kHz pilot signal and a differential signal in the form of two sidebands around a suppressed 38 kHz subcarrier appears at the output of the FM-demodulator. At the output of a first deemphasis means 4 the sum signal L+R then appears, while the differential signal L−R occurs at the output of a second deemphasis means 5, to which the output signal of a multiplier stage 6 is applied, which multiplies the multiplex signal by a 38 kHz signal. The sum and differential signals, respectively at the outputs of the deemphasis means 4 and 5 are then converted in the customary way, not shown further, into signals for the left and right channels, amplified and reproduced by a suitable acoustic transducer.

The oscillator signal for the mixer stage 2 is generated by the frequency-controllable oscillator 7 of a first phase control loop. In addition, the first phase control loop comprises an adjustable frequency divider 8, which reduces the oscillator frequency in accordance with an adjustable factor of n, and also a phase discriminator 9 which compares the frequency-reduced oscillator signal with a reference signal of a constant frequency and at its output produces a signal which corresponds to the phase difference between these two signals and is applied through a low-pass filter 10 to the control input of a frequency-controllable oscillator 7. The frequency is then varied until the phase difference at the output of the phase discriminator 9 has substantially become equal to zero and the oscillator 7 is in synchronism with the reference signal.

The reference signal is produced with the aid of a reference oscillator 11 whose frequency amounts to an integral multiple of the frequency of the pilot signal, that is to say to 4.56 MHz. The frequency of the output signal of the reference oscillator is reduced by a frequency divider 12 in the ratio 1/m and the reduced signal is applied as a reference signal to the phase discriminator 9. In the synchronized state, the frequency of the oscillator 7 is then n/m-times the reference oscillator 11. Up to this point of the description the stereo receiver as shown in FIG. 1 is essentially known. According to the invention, in contrast with the prior art, the reference oscillator is, however, in the form of an electronic frequency-controllable oscillator e.g. a voltage controlled oscillator and is included in a second phase control loop which produces the (38 KHz) subcarrier signal. In addition to the reference oscillator 11, this second phase control loop comprises a frequency divider 13, which reduces the frequency of the output signal of the reference oscillator 11 in the ratio 1/N, where N is constant and amounts to 240 for the above-mentioned value of the oscillator frequency (4.56 MHz) so that the oscillator frequency is reduced to 38 KHz. The output signal of the frequency divider 13 is multiplied in the multiplier stage 6 by the multiplex signal from the output of the FM demodulator 3 and also reduced by means of a further frequency divider 14 in the ratio 1:2, so that a 19 KHz signal is present at the output of this frequency divider. In a phase discriminator 15 said 19 KHz signal is compared with the pilot signal contained in the output signal of the FM-demodulator 3. The output voltage of the phase discriminator, whose amplitude or duty cycle corresponds to the phase difference, is applied through a switch 16, which is in the open condition for mono reception and in the closed condition for stereo reception, to a low-pass filter 17 the filter output is connected to the control input of the reference oscillator 11, so that the frequency of the oscillator 11 is controlled in accordance with the output signal of the phase discriminator 15.

The reference oscillator 11 is preferably a quartz oscillator. The frequency of a quartz oscillator can then be controlled by, for example, a variable diode capacitor, which is connected e.g. in series with the quartz resonator. Such an oscillator has indeed only a comparatively small, but still fully adequate detuning range when the oscillator frequency corresponds to an integral multiple of the frequency of the pilot signal. The switch 16 is operated by a pilot signal detector 18, which is required in stereo receivers and which closes the switch 16 when a pilot signal is detected and in all other cases keeps the switch in the open condition. Such a pilot signal detector does not increase the cost since, as described above, it is required in a stereo receiver.

The circuit operates as follows:

For mono reception, the switch 16 is opened and the oscillator 11 is not synchronized. the first phase control loop then receives a signal having a frequency of 4.56 MHz, whose stability is determined by the properties of the quartz oscillator. For stereo reception, the switch 16 is closed and the reference oscillator 11 is synchronized by the frequency of the pilot signal contained in the multiplex signal. The frequency stability of the reference oscillator depends in this case on the frequency stability of the pilot signal transmitted by the transmitter. As this frequency may fluctuate through ±1 Hz, this corresponds in the VHF-range (100 MHz) to a possible frequency change of ±5 KHz. Such slight frequency shifts do not interfere with the operation of the receiver shown in FIG. 1.

When the phase discriminator 15 is in the form of a multiplying state, its output signal contains an a.c. voltage component, which is produced by multiplying the 19 KHz output signal of the frequency divider 14 by the frequency components(for example 15 KHz) contained in the multiplex signal and is suppressed by the low-pass filter 17. In addition, the direct current operating point of such a phase discriminator is shifted in accordance with the phase difference between the output signal of the frequency divider 14 and the pilot signal contained in the multiplex signal, which causes a corresponding frequency shift of the oscillator 11. Should the multiplex signal not contain a pilot signal, no d.c. voltage shift would occur at the output in the event of an ideal phase discriminator, so that the reference oscillator frequency would not be shifted. Then the switch 16 in the connection between the phase discriminator 15 and the low-pass filter 17 could be dispensed with. However, in practice phase discriminators evidence a dc-offset at their output, so that the frequency of the oscillator 11 would still be shifted, even when no pilot signal is present. This shift might affect the tuning by the first phase control loop in an unacceptable manner, and switch 16 is provided to prevent this. A further possibility is, however, to limit the maximum possible frequency shift. This may be realized by limiting the amplitude at the output of the low-pass filter 17, to a value which does not influence the function of the receiver. Switch 16 could then be omitted.

Figure 2:
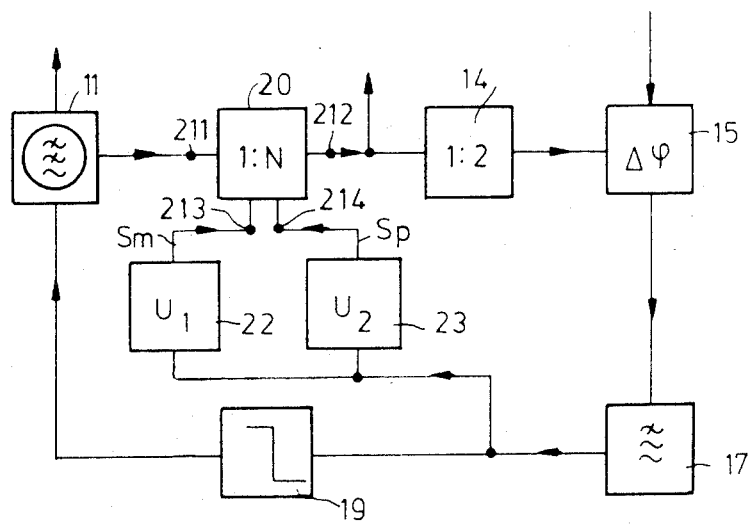
FIG. 2 shows a further embodiment of the second control loop.

FIG. 2 shows the block diagram of the second phase control loop thus modified, the same reference numerals having been used for identical components. The output signal of the phase discriminator 15 is then directly supplied to the low-pass filter 17, and the output of the low-pass filter 17 is connected to the control input of the oscillator 11 through a limiter 19. As a result thereof the maximum possible detuning of the reference oscillator is also limited, so that it cannot assume a value which would interfere with the tuning. This limiting operation lengthens the period of time required to synchronize the oscillator 11 with the pilot signal. This disadvantage caused by the use of the limiter 19 can however be eliminated by using a frequency divider 20 having electronically controllable frequency division ratios in place of frequency divider 13. Input 211 is connected to the output of the oscillator and its output 212 to the input of the 1:2 frequency divider 14. The frequency divider ratio is controlled with the aid of two comparators 22 and 23, the inputs of which are connected to the output of the low-pass filter and the outputs to a control input 213 or 214 of the frequency divider 20.

If the output voltage of the low-pass filter 17 is located in a range between the limits $U_1$ and $U_2$, the output signals $s_m$ and $s_p$ of the comparators 22 and 23, are equal to zero. In this case the frequency divider factor of the frequency divider 20 is exactly 120. The values $U_1$ and $U_2$ are preferably chosen such that that value of the output voltage of low-pass filter 17 at which absolutely no detuning of the oscillator 11 occurs is located halfway between these limits. They should be located between those values at which the limiter 19 produced a limitation. If the output voltage of the low-pass filter 17 is located above $U_1$ and $U_2$, the signal $s_m$ at the input 213 is equal to 1 and the signal $s_p$ at the input 214 is equal to 0. In this case the frequency divider factor is reduced to the value 118. If in contrast therewith the output voltage of the low-pass filter 17 is less than $U_1$ and $U_2$, then $s_p$ is equal to 1 and $s_m$ is equal to 0. In this case the frequency divider factor is increased to the value 122. In both cases the frequency of the output signal is changed by approximately 320 Hz. So even when in the worst case the phase shift would be 180°, the phases of the output signal of the frequency divider 15 and the pilot signal would be synchronized with each other in only a few ms. If however the frequency divider factors were not changed, approximately 500 ms would be required, provided that detuning of the oscillator were limited to approximately $5 \times 10^{-5}$.

Figures 3, 4:
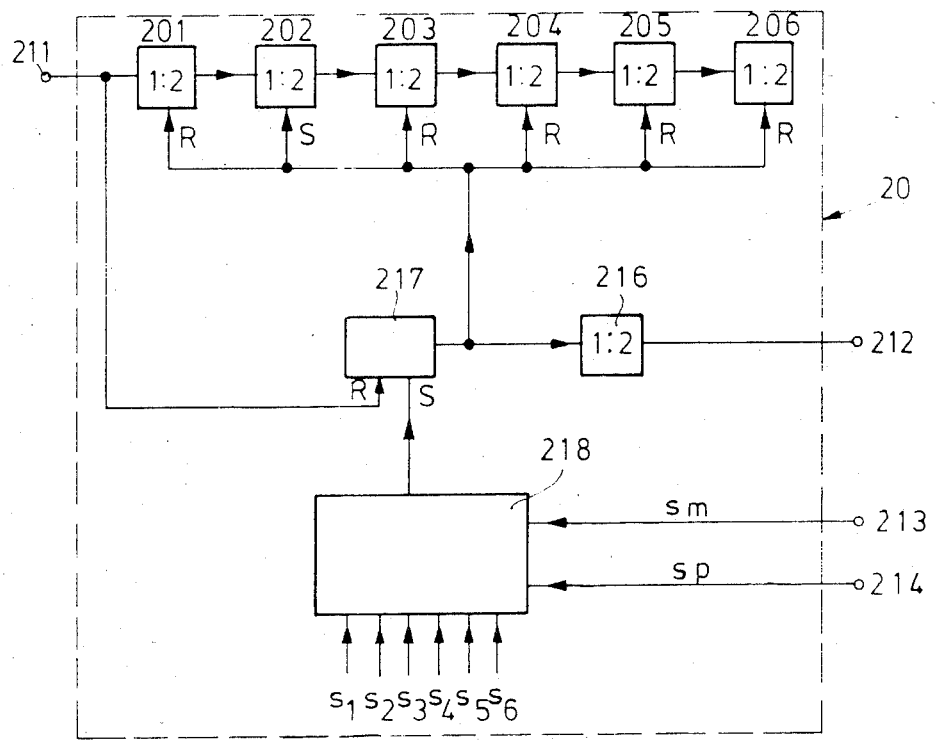
FIG. 3 shows the structure of a counter having controllable frequency divider ratios and being suitable for use in the embodiment shown in FIG. 2
FIG. 4 is a Table showing the static behaviour of the logic processing circuit in the structure shown in FIG. 3.

FIG. 3 shows an embodiment of the frequency divider 20. It comprises six series-arranged 1:2-frequency dividers, which are preferably constituted by toggle-flip-flops (Tietze/Schenck "Halbleiter/Schaltungstechnik", 4th edition 1978, page 166) and are triggered at negative edge transition. The signal is not only applied to the chain of frequency divider zones 1 . . . 206 but also to the input 211 of an inverter 215, whose output is connected to the resetting input of a RS-flipflop whose output is connected to the clockpulse input of a further toggle flipflop 216. The output of this toggle-flipflop constitutes the output 212 of the frequency divider 20.

The setting input of the RS-flipflop 217 is connected to the output of a logic combining circuit 218, which combines the output signals $s_1 \ldots s_6$ of the frequency dividers 201 . . . 206 and also the output signals $s_m$, $s_p$ of the comparators 22 and 23.

The output of the RS-flipflop 217 is furthermore connected to the resetting inputs R of the frequency dividers 201 and also 203 . . . 206, and to the setting input S of the frequency divider 202. For the case in which the output state of the logic combining circuit corresponds to the logic signal "1", the outputs of the frequency divider flipflops 201 and 203 . . . 206 are equal to "0" and the output of the flipflop 202 is equal to "1". If the output signals $s_6 \ldots s_1$ of the frequency dividers 206. . .201 are combined to form a six-bit binary data word, in which the most significant binary bit precedes the least significant binary bit ($s_6$ is the most significant bit—$s_1$ is the least significant bit), then this switching condition corresponds to the data word 000010. This corresponds to the number 2 in the decimal system.

To explain the function of the circuit shown in FIG. 3, let it be assumed that the second phase control loop is in the synchronized state, so that it hold that $s_m = s = 0$. Let it further be assumed that at a predetermined instant the counter formed by the frequency divider flipflops 201 . . . 206 has reached a predetermined counting position. The counting position is then incremented by 1 at each further period of the oscillator signal, until a counting position is reached which corresponds to the data word 111110 (decimal system: 62). as can be seen from the table shown in FIG. 4 which represents those combinations of $s_6 \ldots s_1$, $s_m$, $s_p$ on which the output signal of the logic combining circuit 218 becomes "1" (this output signal is "0" for all other combinations), the output signal of the logic combining circuit then becomes "1", so that the counter 201 . . . 206 is reset to 000010 (decimal system: 2), corresponding to the connection of the setting or resetting inputs. Then there are no longer the conditions at which the output signal of the logic combining circuit is "1", so that the counter then counts up again to 111110, starting from 000010, whereafter the above-described procedure is repeated. So the counter counts only 60 pulses and a 1 to 0 transition, that is to say a negative edge, appears at the output of the RS-flipflop 217 only once in every 60 pulses, so that the period of the signal at the output 212 corresponds accurately to 120 periods at the input 211.

When in the phase control loop shown in FIG. 2 there is a large phase difference between the output signal of the frequency divider 14 and the pilot signal, the comparator 22, for example, responds ($s_m = 1$; $s = 0$). In this case the counter 201 . . . 206 also counts each pulse, however only until a counting position 111101 (decimal system: 61) has been reached. In this case the period duration at the output 212 amounts to $2 \times (61-2) = 118$ periods of the signal at the input 211. When in contrast with the above-assumed case, the phase difference has the opposite sign, then $s_m = 0$ and $s_p = 1$. In that case the counter would count to 111111 (decimal system: 63) and the period of the signal at the output 212 would have a duration of 122 periods of the input signal 211.

Thus there is described a first and second control loop for turning an FM stereophonic signal, as well as demodulating the stereophonic signal using a common reference oscillator.

What is claimed is:

1. In an FM receiver for demodulating an RF carrier signal containing a pilot frequency signal, said receiver having a local oscillator phase locked to a reference signal, mixer means for converting said RF signal into an intermediate frequency signal with said local oscillator signal, and a demodulator for removing said pilot signal from said intermediate frequency signal, a circuit for phase synchronizing said reference signal to the phase of said pilot signal comprising:
   a phase discriminator connected to receive said demodulated pilot signal;
   a reference signal oscillator for generating said reference signal, said reference oscillator having a frequency which is a multiple N of said pilot signal frequency, where N is a constant, said reference signal generator having a phase synchronizing input for receiving a phase control signal from said phase discriminator; and
   a divider circuit for frequency dividing a signal by N, connecting said reference signal genertor output signal to said phase discriminator, whereby said discriminator produces a control voltage proportional to the difference in phase of signals applied to said discriminator from the demodulator and the divider circuit for phase locking said reference signal to said pilot signal.

2. The circuit of claim 1, wherein a low pass filter connects said phase discriminator to said synchronizing input.

3. A circuit according to claim 2, further comprising a switch whose switching state is controlled by a pilot signal detector, connected between the output of the phase discriminator and the input of the low-pass filter.

4. A circuit as claimed in claim 1 wherein the output voltage of the phase discriminator is supplied to said synchronizing input by a limiter.

5. The circuit of claim 1, wherein said divider circuit has a controllable divisor, and further including a means for changing the divisor in accordance with the magnitude of said phase discriminator control voltage output signal.

6. The circuit of claim 1, further comprising a second divider circuit connected to said reference signal oscillator for providing said reference signal.

7. A receiver circuit for tuning and demodulating an RF signal containing a pilot signal comprising:
   a first frequency control loop comprising a reference signal oscillator for generating a phase reference signal, said reference signal oscillator having a synchronizing input for receiving a phase synchronizing signal; a voltage controlled oscillator for providing a local oscillator signal; a phase detector for generating a frequency control signal for said voltage controlled oscillator proportional to the difference in phase between said voltage control oscillator frequency and said reference signal oscillator frequency;
   a mixer circuit for generating an intermediate frequency signal from said RF signal and local oscillator signal;
   an FM demodulator for removing said pilot signal from said intermediate frequency signal;
   a second control loop for providing a synchronizing signal to said first control loop reference signal oscillator synchronizing said reference signal oscillator to said pilot signal comprising:
   a divider connected to the outpout of said reference signal oscillator;
   a second phase detector connected to receive the pilot signal from said FM demodulator and a divided frequency signal from said divider; and
   a filter for connecting the output of said second phase detector to said reference oscillator synchronizing input, whereby said reference oscillator is synchronized with said pilot signal.

* * * * *